United States Patent [19]

Lawson et al.

[11] 4,246,497

[45] Jan. 20, 1981

[54] PHASE MEASURING CIRCUIT

[75] Inventors: Kenneth D. Lawson, Cataumdet; Neil L. Brown, Falmouth, both of Mass.

[73] Assignee: Neil Brown Instruments Systems, Inc., Falmouth, Mass.

[21] Appl. No.: 947,255

[22] Filed: Sep. 29, 1978

[51] Int. Cl.³ .............................................. H03K 5/22
[52] U.S. Cl. ................................... 307/232; 328/133; 324/83 A; 324/83 D
[58] Field of Search ................ 307/232; 328/134, 133; 324/78 E, 78 J, 83 D, 83 A

[56] References Cited

U.S. PATENT DOCUMENTS

| 3,588,710 | 6/1971 | Masters | 328/133 |
| 3,599,102 | 8/1971 | Mous | 324/83 D |
| 4,010,424 | 3/1977 | Faulkner | 307/232 |

*Primary Examiner*—Alfred E. Smith
*Assistant Examiner*—Thomas P. O'Hare
*Attorney, Agent, or Firm*—Sewall P. Bronstein; William H. Lee

[57] ABSTRACT

A circuit for measuring the relative phase of two periodic signals. Two analog waveforms are applied to limiting amplifiers which provide digital output signals. The output signals therefrom are applied to digital circuitry which provides an analog voltage representative of the phase difference between the two input signals over a 360 degree range. The digital circuitry compensates for any offset errors which may be introduced by the limiting amplifiers.

16 Claims, 4 Drawing Figures

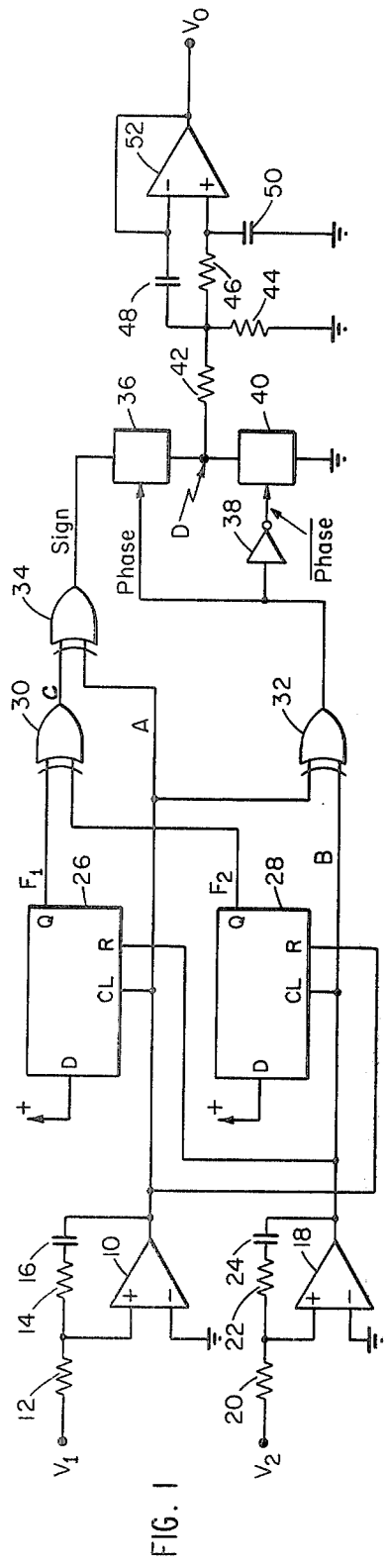
FIG. 1
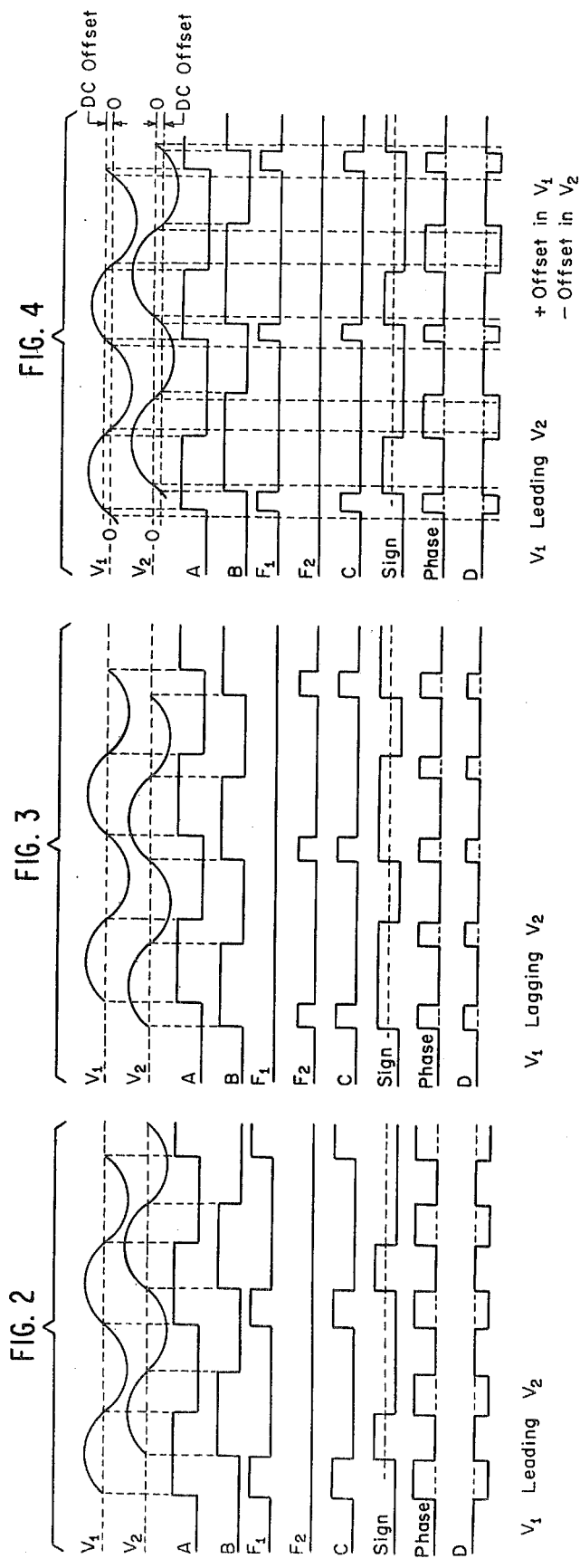
FIG. 4
FIG. 3
FIG. 2

PHASE MEASURING CIRCUIT

FIELD OF THE INVENTION

The present invention is related to circuitry for measuring the relative phase of two signals.

BACKGROUND AND SUMMARY OF THE INVENTION

In electronic circuitry, it is frequently necessary to measure the relative phases of two different signals, and many circuits are known for performing this measurement. With the recent increase in the use of digital circuitry, one common method of measuring the phase of two analog signals is to pass each of the signals through a limiting amplifier to convert the signals to digital signals and then measure the relative phase of the two limited signals using digital circuitry. Where very precise phase measurements are required, offset voltages in the limiting amplifiers may introduce asymmetrical output signals which result in errors in the phase measurement.

The present invention includes a circuit for measuring the relative phase of two sinusoidal signals. In the present invention, the analog waveforms are applied to limiting amplifiers which provide digital output signals. The digital output signal representative of each analog input signal is applied to digital circuitry which provides an analog voltage representative of the phase between the two input signals. The digital circuitry compensates for any offset errors which may be introduced by the limiting amplifiers and provides an analog output representation of the phase which is unaffected by offset errors in the limiting amplifiers. The circuitry is capable of measuring relative phases over a 360 degree range.

DESCRIPTION OF THE DRAWINGS

The operation and advantages of the present invention will become more clear upon reading the following description of the preferred embodiment in conjunction with the accompanying drawings, of which:

FIG. 1 shows the preferred embodiment of the present invention;

FIGS. 2, 3, and 4 show waveforms useful in explaining the operation of the present invention.

DESCRIPTION OF THE PREFERRED EMBODIMENT

Referring to FIG. 1, one embodiment of the present invention which illustrates the operation and advantages thereof is shown. In FIG. 1, the relative phases of two analog waveforms $V_1$ and $V_2$ is to be measured. Typically, these waveforms are sinusoidal. One input signal $V_1$ is applied via an input resistor 12 to the non-inverting input of an operational amplifier 10. The inverting input of op-amp 10 is grounded. Due to the high gain of the op-amp, the output of the op-amp will switch from a negative voltage to a positive voltage as the input waveform passes through zero volts.

A feedback circuit made up of a resistor 14 and a serially connected capacitor 16 provides positive A.C. feedback from the output of op-amp 10 to the non-inverting input. When the output voltage of op-amp 10 begins to switch as the input voltage passes through zero, the change in voltage is coupled through capacitor 16 to the non-inverting input. This positive feedback ensures that the output voltage of op-amp 10 changes state as the input signal passes through zero with no oscillations or other unwanted perturbations.

A second input signal $V_2$ is applied to a second limiting amplifier composed of input resistor 20, op-amp 18, and a series connected feedback circuit composed of resistor 22 and capacitor 24. This limiting amplifier operates in the same manner as described above.

If op-amp 10 and 18 were perfect op-amps with no offset voltage errors, the outputs from the limiting amplifiers could be directly compared to provide a measurement of the relative phases of the input signals $V_1$ and $V_2$. However, in actual practice op-amps 10 and 18 will always have a small offset voltage error. Thus, the digital waveform at the outputs of op-amp 10 and 18 will change state not at the instant when the associated input signal passes through zero, but rather slightly before or slightly after this time, depending on the polarity of the offset error. In this manner, the offset voltage of the op-amps produces a timing error in the digital waveforms from the limiting amplifiers. The circuitry shown in FIG. 1 compensates for this timing error and produces an analog voltage representative of the actual phase relationship between the input signals.

The output from op-amp 10 is applied to the clock input of a D flip flop 26 and is also applied to the reset input of a second D flip flop 28. The output from op-amp 18 is applied to the clock input of D flip flop 28 and the reset input of D flip flop 26. Flip flops 26 and 28 are clocked by a rising edge of a signal applied to the clock inputs. The D inputs of each flip flop are connected to a positive or logical high voltage. If the signal applied to the reset input of flip flop 26 is low, when the output of op-amp 10 goes high flip flop 26 is clocked, and the Q output of flip flop 26 goes high. The Q output remains high until the signal applied to the reset input goes high resetting the flip flop and returning the Q output to a low state. When the output from op-amp 18 applied to the reset input of flip flop 26 is high, the operation of flip flop 26 is disabled, and the output of flip flop 26 will remain in the low state regardless of the waveform applied to the clock input. Flip flop 28 operates in the same manner as flip flop 26, except that the clock input to flip flop 28 is provided by op-amp 18 while the reset input to flip flop 28 is provided by op-amp 10.

The outputs from op-amps 10 and 18 are applied to an XOR gate 32. The output of gate 32 represents the magnitude of the phase of the input signals $V_1$ and $V_2$ and is denoted in FIG. 1 as the PHASE signal. The phase signal is applied to an analog switch 36. The inverse of the PHASE signal denoted in FIG. 1 as PHASE is provided by an inverter 38 and is applied as the control signal to a second analog switch 40. Analogs switches 36 and 40 may be implemented, for example, by means of a 4066 CMOS circuit.

The outputs from flip flops 26 and 28, respectively denoted in FIG. 1 as $F_1$ and $F_2$, are applied to an XOR gate 30. The output of XOR gate 30 is combined with the output from op-amp 10 via another XOR gate 34. The output signal from XOR gate 34 represents the sign of the phase difference between the input signals.

In response to the phase signal from XOR gate 32, analog switch 36 selectively connects the SIGN signal from XOR gate 34 to node D in FIG. 1. In response to the PHASE signal from inverter 38, analog switch 40 selectively connects node D to ground. The signal at node D is applied via a resistor 42 to a two-pole low pass filter circuit which filters the signal present at node D to provide a D.C. output signal $V_o$ which represents the phase of the input signals. In the circuit shown in FIG. 1, the filter is implemented by means of an active filter circuit of a well known type composed of resistors 44 and 46, capacitors 48 and 50, and op-amp 52, connected as shown.

When the SIGN output from XOR gate 34 is high indicating a positive phase difference, a positive SIGN signal is applied to one input of analog switch 36. In response to the PHASE signal from XOR gate 32, switches 36 and 40 alternately connect the SIGN signal and ground to node D to provide a pulse-width-modulated signal switching between ground and a positive voltage at node D representative of the phase difference. Similarly when the SIGN output from XOR gate 34 is low indicating a negative phase difference, a negative voltage is applied to switch 36. In this case, the signal at node D is a pulse-width-modulated signal switching between ground and a negative voltage which represents a negative phase difference between the input signals. The signal at node D is filtered by the above-described filter 44-52 to provide a steady D.C. signal $V_o$ representative of the phase difference of the input signals.

The operation of the circuitry shown in FIG. 1 may be more clearly understood by referring to FIGS. 2, 3, and 4 which show the waveforms at various points in the circuit for various situations. In FIG. 2, the input waveforms, denoted as $V_1$ and $V_2$ are shown with the phase of the $V_1$ leading the phase of $V_2$. In response to such input signals $V_1$ and $V_2$, op-amps 10 and 18 respectively provide the output signals denoted as A and B. The output from flip flop 26, denoted as $F_1$, is a pulse-width-modulated signal, as shown in FIG. 2. Since the output from op-amp 10 applied to the reset input of flip flop 28 is always high during positive transitions from op-amp 18, flip flop 28 is not clocked and the output $F_2$ therefrom remains low. The output from XOR gate 30 is denoted as waveform C in FIG. 2, and this waveform is exclusive-ored with the output A from op-amp 10 to provide the SIGN waveform shown in FIG. 2. The PHASE signal is produced by exclusive-orring the outputs from op-amps 10 and 18, as shown in FIG. 2. In response to the SIGN and PHASE waveforms shown, the waveform at node D is a pulse-width-modulated waveform switching between zero and a negative voltage. An inspection of FIG. 2 shows that as the phase relationship of $V_1$ and $V_2$ changes from zero to $-180$ degrees, the duty cycle of the waveform at node D changes from zero to 100 percent to provide an average voltage representative of the phase. This signal is filtered as described above to provide a D.C. output voltage $V_o$ representative of the phase.

FIG. 3 shows waveforms occurring at the various points in the circuit of FIG. 1 for the case when input signal $V_1$ is lagging input $V_2$. The waveforms shown in FIG. 3 are similar to those shown in FIG. 2 with the following exceptions. In FIG. 3 it can be seen that the $F_1$ output from flip flop 26 remains low at all times since the rising edge of the output from op-amp 10 occurs while the output signal from op-amp 18 is high, inhibiting flip flop 26. It can be further seen from FIG. 3 that the sign and phase signals are such that the waveform at node D is a pulse-width-modulated signal switching between ground and a positive voltage. Thus, the output voltage in this case varies between zero and a positive voltage in accordance with the relative phase of the input signals.

The circuitry shown in FIG. 1 had advantages over previously known phase comparison circuitry in that phase errors in the outputs from op-amps 10 and 18 resulting from D.C. offset errors are corrected by a simple and easily implemented circuit. Referring to FIG. 4 a situation is shown where the $V_1$ input signal leads the $V_2$ input signal and where op-amp 10 has a positive offset voltage and op-amp 18 has a negative offset voltage. The offset voltages are illustrated by the horizontal dotted lines offset from the zero datum in the $V_1$ and $V_2$ waveforms in FIG. 4; and the timing errors resulting from these offset voltages are pointed out by the vertical dotted lines in FIG. 4. Typically, the offset voltages in the operational amplifiers are a small enough percentage of the amplitude of the input waveforms that timing errors resulting from offset voltages are essentially proportional to the offset voltage error.

It can be seen from FIG. 4 that an analog offset error in the limiting amplifiers produces a corresponding timing offset error in the digital waveform from the limiting amplifier in the form of asymmetry in the nominally square wave signal representing the analog input signal. It should be apparent that the circuitry following the output of op-amps 10 and 18 may be used to compensate for such timing offset errors in other digital waveforms.

From FIG. 4, it can be seen that the phase signal is a pulse-width-modulated waveform of varying duty cycle whose average duty cycle represents the phase difference between the input signals, independent of offset voltages in the operational amplifiers 10 and 18. Since the PHASE signal represents the magnitude of the phase, the average voltage at node D is representative of the true phase difference of the input signals.

There has been described a novel circuit for comparing two analog waveforms and providing a signal representative of the phase therebetween without errors induced by amplifier offset voltages. It should be clear that modifications and additions to the preferred embodiment described herein will be made in applying the teachings of the present application to various situations. Therefore, the above description of a preferred embodiment for purposes of illustration should not be taken as a limitation upon the present invention, but rather the scope of the present invention should be interpreted solely in accordance with the appended claims.

What is claimed is:

1. A circuit for measuring a phase difference between two periodic digital input signals and for providing an output representation of the phase difference therebetween without errors caused by asymmetrical timing offset errors in the digital waveforms, comprising:

phase means for exclusive-orring the input signals to provide a pulse-width-modulated output signal representative of the magnitude of the phase difference;

sign means responsive to transitions in the input signals for providing an output signal representative of the sign of the phase difference;

output means responsive to the phase means output signal and to the sign means output signal for providing an output representation of the phase difference such that error caused by offset of the input signals is eliminated.

2. The circuit of claim 1 wherein the output means provides the output representation in the form of a single analog signal.

3. A circuit for measuring a phase difference between two periodic analog waveforms and for producing an output representation of the phase difference, comprising:

two limiting input amplifiers each for receiving a respective one of the two analog waveforms and each for providing a two-level input signal representative of the respective analog waveform;

phase means responsive to the input signals for providing a pulse-width-modulated output signal representative of the magnitude of the phase difference;

sign means responsive to the input signals for providing an output signal representative of the sign of the phase difference; and output means responsive to the phase means output signal and to the sign means output signal for providing the output representation of the phase difference without error caused by offset of the input signals, including:

means for providing an intermediate pulse-width-modulated signal having an average value representative of the phase difference; and means for averaging the intermediate pulse-width-modulated signal to provide an analog signal representative of the phase difference.

4. A circuit for measuring a phase difference between two periodic digital input signals and for providing an output representation of the phase difference therebetween without errors caused by asymmetrical timing offset errors in the digital waveforms, comprising:

phase means responsive to the input signals for providing a pulse-width-modulated output signal representative of the magnitude of the phase difference;

sign means responsive to the input signals for providing an output signal representative of the sign of the phase difference; and output means responsive to the phase means output signal and to the sign means output signal for providing the output representation of the phase difference without error caused by offset of the input signals, including:

means for providing an intermediate pulse-width-modulated signal having an average value representative of the phase difference; and means for averaging the intermediate pulse-width-modulated signal to provide an analog signal representative of the phase difference.

5. A circuit for comparing two periodic input signals and for providing an output representation of the phase difference between the two input signals without error caused by offset of either of the input signals, comprising:

phase means responsive to the input signals for providing a pulse-width-modulated output signal representative of the magnitude of the phase difference;

sign means responsive to the input signals for providing an output signal representative of the sign of the phase difference; and output means responsive to the phase means output signal and to the sign means output signal for providing the output representation of the phase difference without error caused by offset of the input signals, including:

means for providing an intermediate pulse-width-modulated signal having an average value representative of the phase difference; and means for averaging the intermediate pulse-width-modulated signal to provide an analog signal representative of the phase difference.

6. A circuit for measuring a phase difference between two periodic analog waveforms and for producing an output representation of the phase difference, comprising:

two limiting input amplifiers each for receiving a respective one of the two analog waveforms and each for providing a two-level input signal representative of the respective analog waveform;

phase means responsive to the input signals for providing a pulse-width-modulated output signal representative of the magnitude of the phase difference;

sign means responsive to the input signals for providing an output signal representative of the sign of the phase difference, including first and second flip flops, each for providing an output signal having one of two possible states;

the first flip flop providing an output of a selected state in response to transitions of a selected polarity of a first one of the input signals in the absence of the second input signal having a selected value;

the second flip flop providing an output signal of a selected state in response to transitions of a selected polarity in the second input signal in the absence of the first input signal having a selected value; and output means responsive to the phase means output signal and to the sign means output signal for providing the output representation of the phase difference without error caused by offset of the input signals.

7. A circuit for measuring a phase difference between two periodic digital input signals and for providing an output representation of the phase difference therebetween without errors caused by asymmetrical timing offset errors in the digital waveforms, comprising:

phase means responsive to the input signals for providing a pulse-width-modulated output signal representative of the magnitude of the phase difference;

sign means responsive to the input signals for providing an output signal representative of the sign of the phase difference, including first and second flip flops each for providing an output signal having one of two possible states;

the first flip flop providing an output of a selected state in response to transitions of a selected polarity of a first one of the input signals in the absence of the second input signal having a selected value;

the second flip flop providing an output signal of a selected state in response to transitions of a selected polarity in the second input signal in the second input signal in the absence of the first input signal having a selected value; and output means responsive to the phase means output signal and to the sign means output signal for providing the output representation of the phase difference without error caused by offset of the input signals.

8. A circuit for comparing two periodic input signals and for providing an output representation of the phase difference between the two input signals without error caused by offset of either of the input signals, comprising:

phase means responsive to the input signals for providing a pulse-width-modulated output signal representative of the magnitude of the phase difference;

sign means responsive to the input signals for providing an output signal representative of the sign of the phase difference, including first and second flip flops each for providing an output signal having one of two possible states;

the first flip flop providing an output of a selected state in response to transitions of a selected polarity of a first one of the input signals in the absence of the second input signal having a selected value;

the second flip flop providing an output signal of a selected state in response to transitions of a selected polarity in the second input signal in the absence of the first input signal having a selected value; and output means responsive to the phase means output signal and to the sign means output signal for providing the output representation of the phase difference without error caused by offset of the input signals.

9. The circuit of claim 6 wherein the phase means includes means for exclusive-orring the input signals to provide an output signal representative of the exclusive-or product therebetween.

10. The circuit of claim 9 wherein the sign means further includes:

second means for exclusive-orring the first and second flip flop output signals to provide an output signal representative of the exclusive-or product therebetween;

third means for exclusive-orring the second exclusive-orring means output signal with one of the input signals to provide an output signal representative of the sign of the phase difference.

11. The circuit of claim 10 further including:

a summing node;

switch means responsive to the phase means output signal for selectively connecting the sign means output signal and a ground signal to the summing node to provide a pulse-width-modulated signal representative of the phase difference.

12. The circuit of claim 11 further including a low-pass filter responsive to the signal at the summing node for providing an analog signal representative of the phase difference.

13. The circuit of claim 12 wherein the first and second flip flops are clocked flip flops having an edge-triggered clock input for causing a change in the flip flop output signal from a first state to a second state and having a reset input for causing the flip flop to remain in the first state in response to a predetermined signal applied thereto.

14. The circuit of claim 3 wherein each of the limiting amplifiers includes:

a high gain amplifier; and means for providing positive A.C. feedback from the output of the high-gain amplifier to the input thereof.

15. The circuit of claim 14 wherein the means for providing feedback includes a capacitor connected in series with the feedback path.

16. The circuit of claims 3, 4, or 5 wherein the output means provides a unique output representation of the phase difference between the input waveforms over a 360 degree range.

* * * * *

UNITED STATES PATENT AND TRADEMARK OFFICE
CERTIFICATE OF CORRECTION

PATENT NO. : 4,246,497
DATED : January 20, 1981
INVENTOR(S) : Kenneth D. Lawson and Neil L. Brown It is certified that error appears in the above-identified patent and that said Letters Patent are hereby corrected as shown below:

ON THE TITLE PAGE:

Change the inventor's address from "Cataumdet" to

---Cataumet---.

Col. 4, line 1, change "had" to ---has---.

Col. 6, Claim 7, line 21, delete "in the second input signal" (first occurrence).

Signed and Sealed this

Thirteenth Day of April 1982

[SEAL]

Attest:

Attesting Officer

GERALD J. MOSSINGHOFF

Commissioner of Patents and Trademarks